United States Patent
Pan et al.

(10) Patent No.: US 9,006,053 B2
(45) Date of Patent: *Apr. 14, 2015

(54) METHOD OF MAKING MOSFET INTEGRATED WITH SCHOTTKY DIODE WITH SIMPLIFIED ONE-TIME TOP-CONTACT TRENCH ETCHING

(71) Applicant: Alpha and Omega Semiconductor Incorporated, Sunnyvale, CA (US)

(72) Inventors: Ji Pan, San Jose, CA (US); Daniel Ng, Campbell, CA (US); Sung-Shan Tai, San Jose, CA (US); Anup Bhalla, Santa Clara, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 34 days.

This patent is subject to a terminal disclaimer.

(21) Appl. No.: 14/264,318

(22) Filed: Apr. 29, 2014

(65) Prior Publication Data
US 2014/0235024 A1    Aug. 21, 2014

Related U.S. Application Data

(63) Continuation of application No. 13/722,930, filed on Dec. 20, 2012, now Pat. No. 8,748,268.

(51) Int. Cl.
H01L 21/336    (2006.01)
H01L 21/265    (2006.01)
H01L 21/82     (2006.01)
H01L 27/06     (2006.01)
H01L 21/8234   (2006.01)

(52) U.S. Cl.
CPC .......... H01L 21/26513 (2013.01); H01L 21/82 (2013.01); H01L 27/0629 (2013.01); H01L 21/823412 (2013.01)

(58) Field of Classification Search
CPC ............ H01L 29/7806; H01L 29/7813; H01L 29/66734
USPC .......................... 438/142, 167, 259, 270, 534; 257/E21.655
See application file for complete search history.

(56) References Cited

U.S. PATENT DOCUMENTS 8,748,268 B1*    6/2014    Pan et al. ...................... 438/270

* cited by examiner

*Primary Examiner* — Thanhha Pham
(74) *Attorney, Agent, or Firm* — Chein-Hwa Tsao; CH Emily LLC (57) ABSTRACT

Method for fabricating MOSFET integrated with Schottky diode (MOSFET/SKY) is disclosed. Gate trench is formed in an epitaxial layer overlaying semiconductor substrate, gate material is deposited therein. Body, source, dielectric regions are successively formed upon epitaxial layer and the gate trench. Top contact trench (TCT) is etched with vertical side walls defining Schottky diode cross-sectional width SDCW through dielectric and source region defining source-contact depth (SCD); and partially into body region by total body-contact depth (TBCD). A heavily-doped embedded body implant region (EBIR) of body-contact depth (BCD)<TBCD is created into side walls of TCT and beneath SCD. An embedded Shannon implant region (ESIR) is created into sub-contact trench zone (SCTZ) beneath TCT floor. A metal layer is formed in contact with ESIR, body and source region. The metal layer also fills TCT and covers dielectric region thus completing the MOSFET/SKY with only one-time etching of its TCT.

8 Claims, 9 Drawing Sheets

Present Invention

FIG. 1

FIG. 2A Present Invention

FIG. 2B Present Invention

FIG. 2C Present Invention

FIG. 2D Present Invention

FIG. 2E Present Invention

FIG. 2F Present Invention

FIG. 2G Present Invention

FIG. 2H Present Invention

METHOD OF MAKING MOSFET INTEGRATED WITH SCHOTTKY DIODE WITH SIMPLIFIED ONE-TIME TOP-CONTACT TRENCH ETCHING

CROSS REFERENCE TO RELATED APPLICATIONS

This application is a Continuation of a commonly owned pending US application entitled "Method of Making MOSFET Integrated with Schottky Diode with Simplified One-time Top-Contact Trench Etching", by Ji Pan et al with application Ser. No. 13/722,930, filing date Dec. 20, 2012, whose content, hereinafter referred to as APOM075, is herein incorporated by reference for any and all purposes.

In addition, this application is related to the following US patent documents whose contents are herein also incorporated by reference for any and all purposes:

[A] entitled "Power MOS Device" with application Ser. No. 11/056,346 filed on Feb. 11, 2005 and issued on Oct. 23, 2007 as U.S. Pat. No. 7,285,822, hereinafter referred to as ALPHP004.

[B] entitled "MOS DEVICE WITH INTEGRATED SCHOTTKY DIODE IN ACTIVE REGION CONTACT TRENCH" with application Ser. No. 12/005,146 filed on Dec. 21, 2007 and issued on Jan. 10, 2012 as U.S. Pat. No. 8,093,651, hereinafter referred to as ALPHP005.

[C] entitled "MOS DEVICE WITH SCHOTTKY BARRIER CONTROLLING LAYER" with application Ser. No. 12/005,166 filed on Dec. 21, 2007, hereinafter referred to as ALPHP008.

[D] entitled "MOS DEVICE WITH LOW INJECTION DIODE" with application Ser. No. 12/005,130 filed on Dec. 21, 2007, hereinafter referred to as ALPHP009.

FIELD OF INVENTION

This invention relates generally to the field of semiconductor device structure. More specifically, the present invention is directed to a manufacturing method to form a MOSFET device integrated with a Schottky Diode (MOSFET/SKY).

BACKGROUND OF THE INVENTION

ALPHP004 disclosed a semiconductor MOSFET device, with associated manufacturing method, having a gate trench extending through its source and body into its drain, a gate disposed in the gate trench, a source body contact trench having a trench wall and an anti-punch through implant that is disposed along the trench wall. Corresponding to the existence of gate trench and source body contact trench, two contact etchings may be required for device manufacturing.

ALPHP005 disclosed a semiconductor MOSFET device, with associated manufacturing method, formed on a semiconductor substrate. The device comprises a drain, an epitaxial layer overlaying the drain, and an active region. The active region comprises, inter alia, a gate trench extending into the epitaxial layer and an active region contact trench extending through the MOSFET source and at least part of the MOSFET body into the drain. As illustrated in FIG. 4O (first contact etch) and FIG. 4R (second contact etch) with accompanying descriptive text in the ALPHP005 specification, two contact etchings are required for device manufacturing.

ALPHP008 disclosed a MOS device with integrated Schottky barrier controlling layer and ALPHP009 disclosed a MOS device with integrated low injection diode.

Thus, while the structure of a MOSFET device integrated with a Schottky Diode (MOSFET/SKY) is known in the art, the present invention is directed to its manufacturing method that is simplified and that also produces devices with more consistent device performance. More specifically, to those skilled in the art, it is not uncommon to see substantial trench geometrical tolerances around +/−10% resulting from contact etching. Multiple contact etching steps, in addition to complicating the manufacturing process, will compound thus aggravating the already substantial trench geometrical tolerances from a single contact etching. Therefore, the present invention deals with making an MOSFET/SKY with simplified one-time top-contact trench etching.

BRIEF DESCRIPTION OF THE DRAWINGS

To describe numerous embodiments of the present invention, reference is made to the accompanying drawings. However, these drawings are not to be considered limitations in the scope of the invention, but are merely illustrative.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 1:
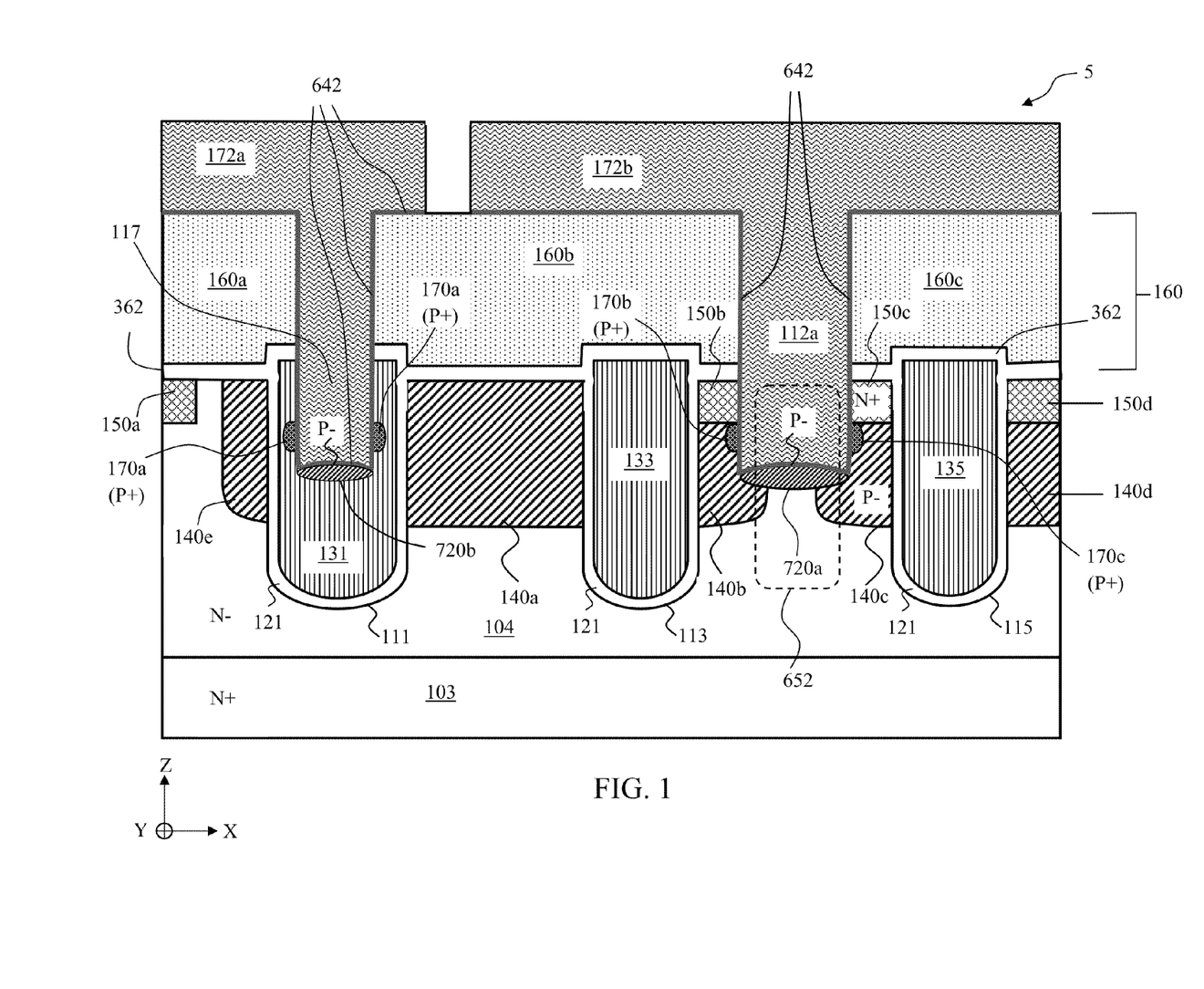
FIG. 1 illustrates a plane cross sectional view of a MOSFET/SKY device.

FIG. 1 illustrates a plane cross sectional view of a MOSFET integrated with Schottky diode (MOSFET/SKY) 5. To facilitate description of spatial, structural relationships within the device, an X-Y-Z Cartesian coordinate system with the X-Y plane parallel to the major semiconductor chip plane is employed. The MOSFET/SKY 5 includes a drain that is formed on the back of an $N^+$-type semiconductor substrate (SCST) 103. The drain region extends into an epitaxial layer (EPIL) 104 of $N^−$-type semiconductor that overlays SCST 103. Gate trenches such as 111, 113, and 115 are etched in EPIL 104. A gate oxide layer 121 is formed inside the gate trenches. Gates 131, 133 and 135 are disposed inside gate trenches 111, 113 and 115, respectively, and are insulated from the EPIL 104 by the gate oxide layer 121. The gates 131, 133 and 135 are made of a conductive material such as polycrystalline silicon (poly) and the gate oxide layer 121 is made of an insulating material such as thermal oxide. Specifically, gate trench 111 is located in a gate contact region while gate trenches 113 and 115 are located in an active device region.

Source regions 150b-150d are embedded in body regions 140b-140d, respectively. The source regions extend downward from the top surface of the body into the body itself. While body regions are implanted along the side surfaces of all gate trenches, source regions are only implanted next to active gate trenches. In this illustrated example, gates such as 133 have a gate top surface that extends substantially above the top surface of the body where the source is embedded. Such a configuration guarantees the overlap of the gate and the source, allowing the source region to be shallower than the source region of a device with a recessed gate, and increases device efficiency and performance. The amount by which the gate poly top surface extends above the source-body junction may vary for different embodiments. In some embodiments, the gates of the device do not extend above the top surface of the source-body region.

During operation, the drain region and the body regions together act as a diode, referred to as the body diode. A dielectric material layer 160 is disposed over the gate to insulate the gate from source-body contact. The dielectric material forms insulating regions such as 160a-160c on top of the gates as well as on top of the body and source regions. Appropriate dielectric materials include thermal oxide, low temperature oxide (LTO), boro-phospho-silicate glass (BPSG), etc.

A number of contact trenches such as 112a are formed between the active gate trenches near the source and body regions. These trenches are referred to as active region contact trenches since the trenches are adjacent to the device's active region that is formed by the source and body regions. For example, the contact trench 112a extends through the source and into the body, forming source regions 150b-150c and body regions 140b-140c adjacent to the trench. In contrast, a gate contact trench 117, which is formed on top of gate 131, is not located next to an active region, and therefore is not an active region contact trench. Trench 117 is referred to as a gate contact trench or gate runner contact trench since a metal layer 172a connected to the gate signal is deposited within the gate contact trench 117. Gate signal is fed to active gates 133 and 135 through interconnections between gate trenches 111, 113 and 115 in the third dimension (not shown). Metal layer 172a is separated from metal layer 172b, which connects to source and body regions through contact trench 112a to supply a power source. In the example shown, the active region contact trench and gate contact trench have approximately the same depth. Notice the existence of contact barrier layers 642 at the undersides of the metal layers 172a and 172b. For those skilled in the art, these contact barrier layers can be made of Ti/TiN and function to make better and more reliable electrical contact at their respective metal-to-semiconductor interfaces.

In the example shown, regions such as 170b-170c within the body and along the walls of the active region contact trench are heavily doped with P type material to form P+-type regions referred to as body contact implant regions. These body contact implants are included to ensure that Ohmic contact is formed between the body and the source metal therefore the source and the body have the same potential. Also, within the gate 131 and along the walls of the gate contact trench 117 are another heavily doped P+-type regions 170a to achieve an Ohmic contact.

A conductive material is disposed in the contact trench 112a as well as the gate contact trench 117 to form contact electrodes. At the interface between the contact trench 112a and the EPIL 104 is an embedded P− type Shannon-implant region (ESIR) 720a. Also, at the interface between the gate contact trench 117 and the gate 131 is another embedded P−type Shannon-implant region (ESIR) 720b. While the ESIR 720b does not provide significant electrical function, for those skilled in the art a Schottky diode 652, in parallel with the body diode, is formed in the active region along the path of contact trench 112a-ESIR 720a-EPIL 104. The Schottky diode 652 reduces the body diode's forward voltage drop and minimizes the stored charge, making the MOSFET more efficient. A single metal that is capable of simultaneously forming a Schottky contact to the $N^-$ drain (EPIL 104) and forming good Ohmic contact to the $P^+$ body and $N^+$ source is used to fill the contact trench 112a as well as the gate contact trench 117. Metals such as titanium (Ti), platinum (Pt), palladium (Pd), tungsten (W) or any other appropriate material may be used. In some embodiments, metal layer 172 is made of aluminum (Al) or made of a Ti/TiN/Al stack.

Figure 2A:
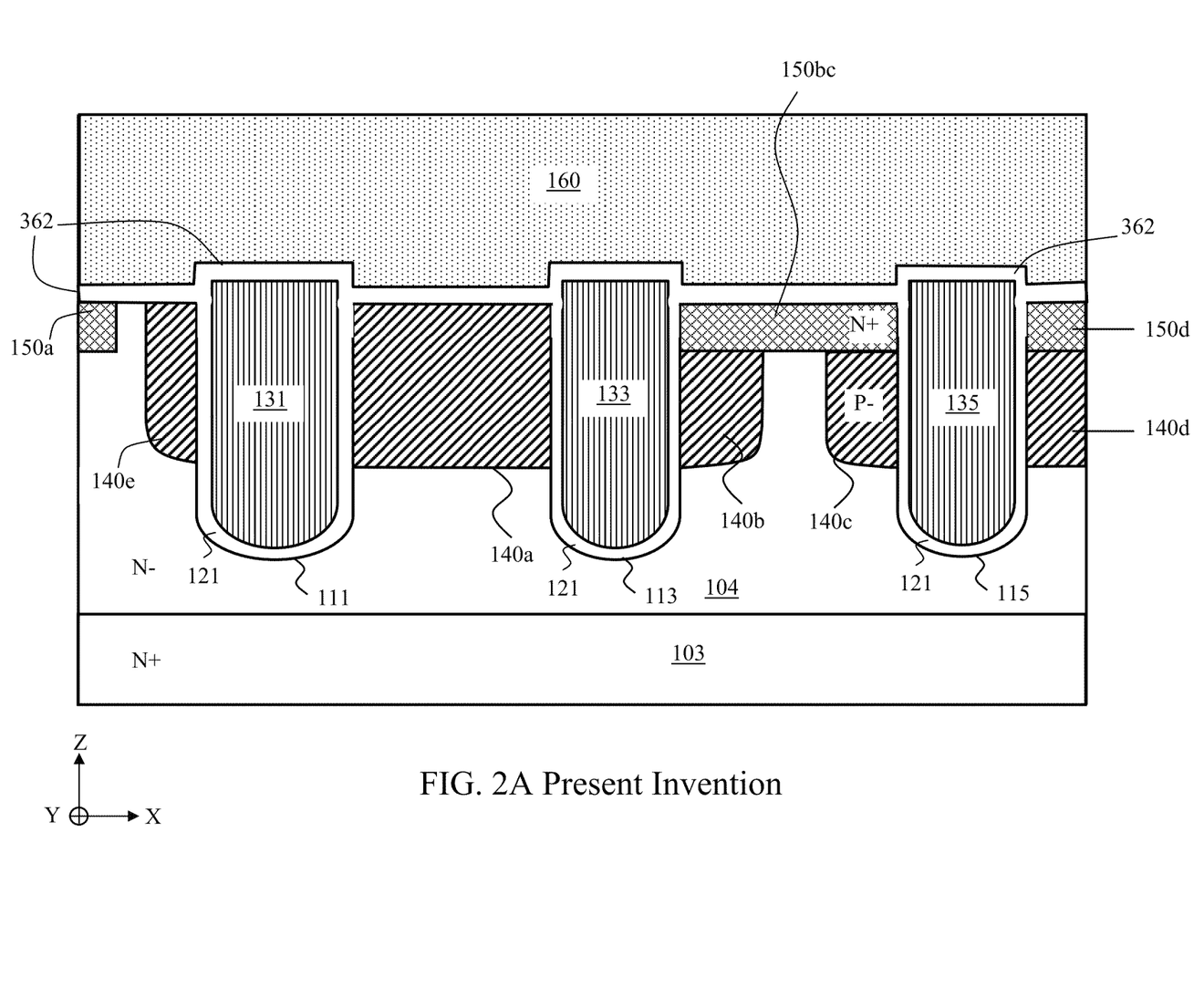
FIG. 2A-FIG. 2H illustrate the present invention process steps for making the MOSFET/SKY device of FIG. 1.

FIG. 2A-FIG. 2H illustrate process steps under the present invention for making the MOSFET/SKY device of FIG. 1. FIG. 2A illustrates the result of the following steps:

a) Formation, in an epitaxial layer (EPIL) 104 overlaying a semiconductor substrate (SCST) 103, of gate trenches 111, 113 and 115. Formation of a gate oxide layer 121 then deposition of gate materials 131, 133 and 135 respectively inside the gate trenches 111, 113 and 115.

b) Formation of body regions 140a, 140b, 140c, 140d and 140e, in the EPIL 104. Formation, with ion implantation, of source regions 150a, 150b, 150c and 150d atop the body regions 140b, 140c and 140d. Formation of an oxide layer 362 then formation of a dielectric material layer 160 atop the oxide layer 362 and above the gate trenches 111, 113 and 115 and the source regions 150a, 150bc, and 150d.

As a general remark about device dimensional control for ion implantation, it is a process step wherein the implantation thickness/depth is decided by implant energy and its following drive-in thermal budget. As an example for the creation of source regions 150a, 150bc and 150d, a heavy dose of arsenic (As) ions could be implanted into a semiconductor silicon surface. Next, a source drive-in step makes the As ions diffuse inside the silicon with a depth around 0.2~0.5 micron. For a more detailed breakdown and illustration of the above steps, reference can be made to FIG. 3A through FIG. 3N and their accompanying descriptions of APOM063.

Figure 2B:
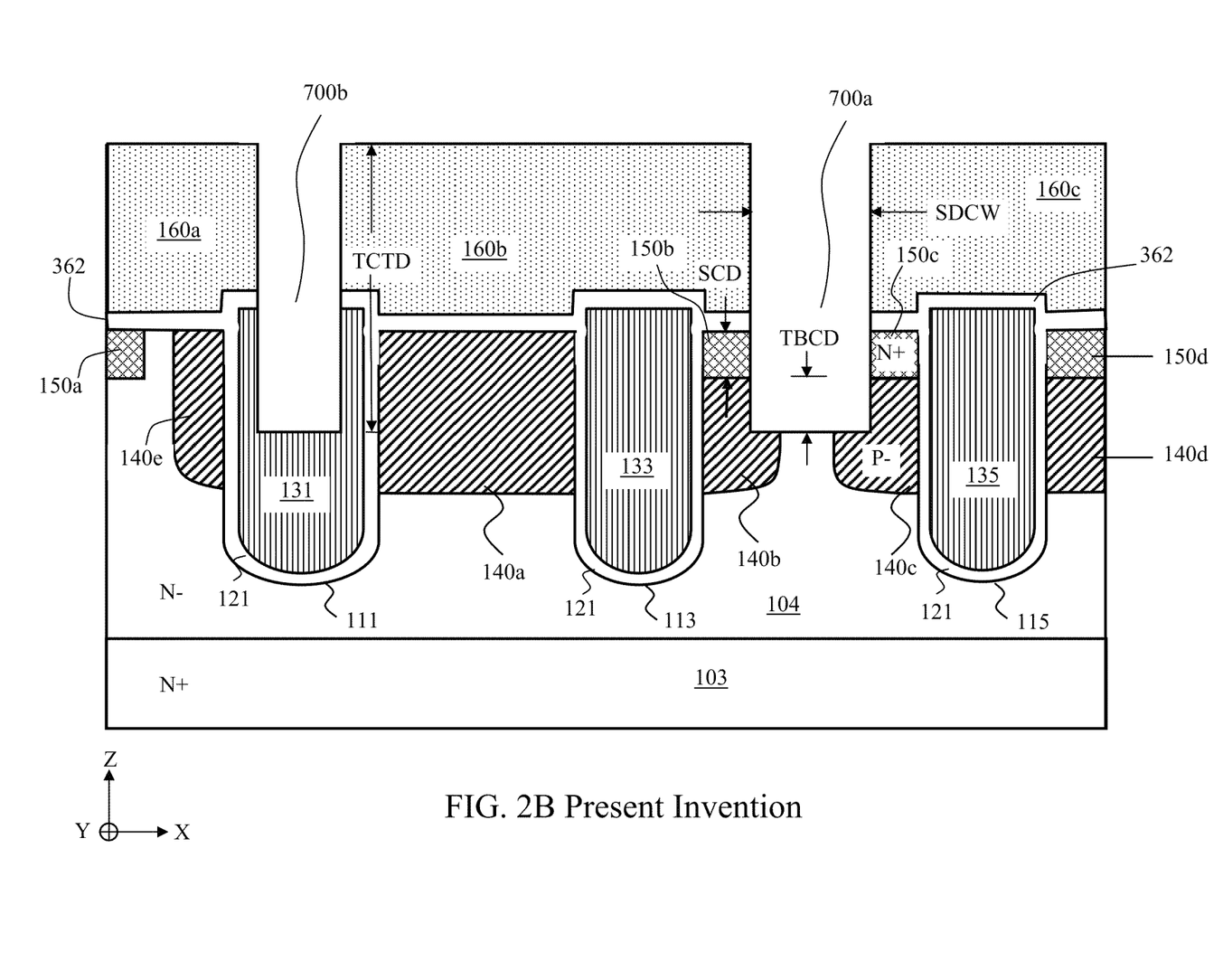

FIG. 2B illustrates the result of the following step:

c) Anisotropically etching top contact trenches (TCT) 700a and 700b of equal top contact trench depth (TCTD) such that:

c1) TCT 700a goes through the dielectric material layer 160 and the source region 150bc. Consequently the source region 150bc is separated into source regions 150b and 150c each with a source-contact depth (SCD). Additionally, the dielectric material layer 160 is separated into insulating regions 160a, 160b, and 160c.

c2) TCT 700a goes partially into the body regions 140b, 140c by a predetermined total body-contact depth (TBCD).

In addition, the vertical side walls of the TCT 700a define a Schottky diode cross-sectional width (SDCW), to be presently described in more detail.

FIG. 2C through FIG. 2G illustrate the following steps:

d1) Creation, into the side walls of TCT 700a and 700b and beneath the SCD, a number of heavily-doped embedded body implant regions (EBIR) 710a, 710b of body-contact depth (BCD)<TBCD.

d2) Creation, into a sub-contact trench zone (SCTZ) beneath the floor of TCT 700a and 700b, a number of embedded Shannon implant regions (ESIR) 720a, 720b.

Wherein, FIG. 2C through FIG. 2F illustrate the following step:

d11) Implantation of the heavily-doped EBIR 710a, 710b while keeping the SCTZ essentially free of any concomitant body-contact implantation.

Figure 2C:
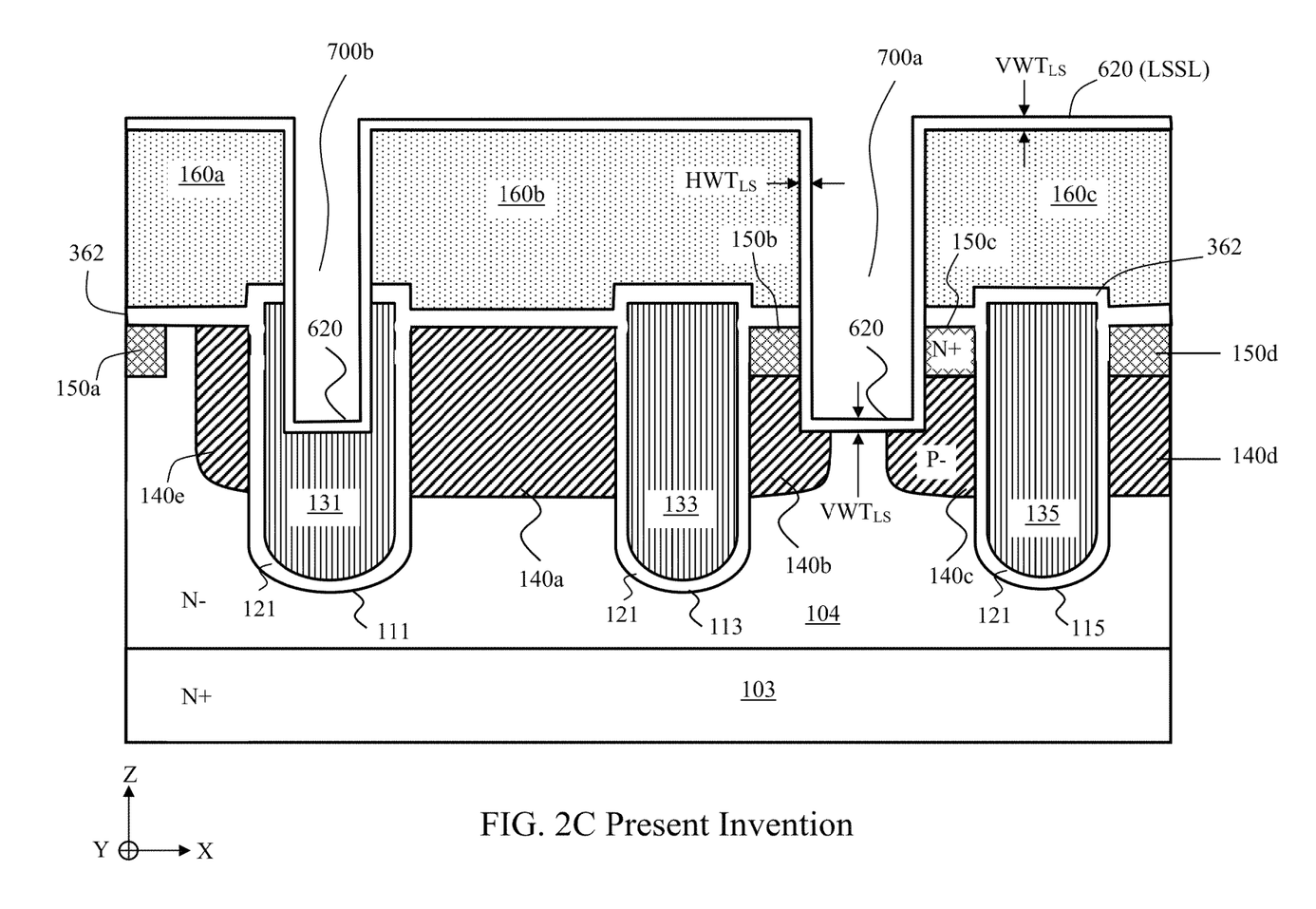

FIG. 2C illustrates the following step:

d111) Formation of a lower spacer sub-layer (LSSL) 620 of horizontal wall thickness ($HWT_{LS}$) atop the side walls of TCT 700a and 700b and of vertical wall thickness ($VWT_{LS}$) atop the bottom floor of TCT 700a and 700b and atop the insulating regions 160a, 160b, and 160c. Where $VWT_{LS}$ essentially equals to $HWT_{LS}$.

Figure 2D:
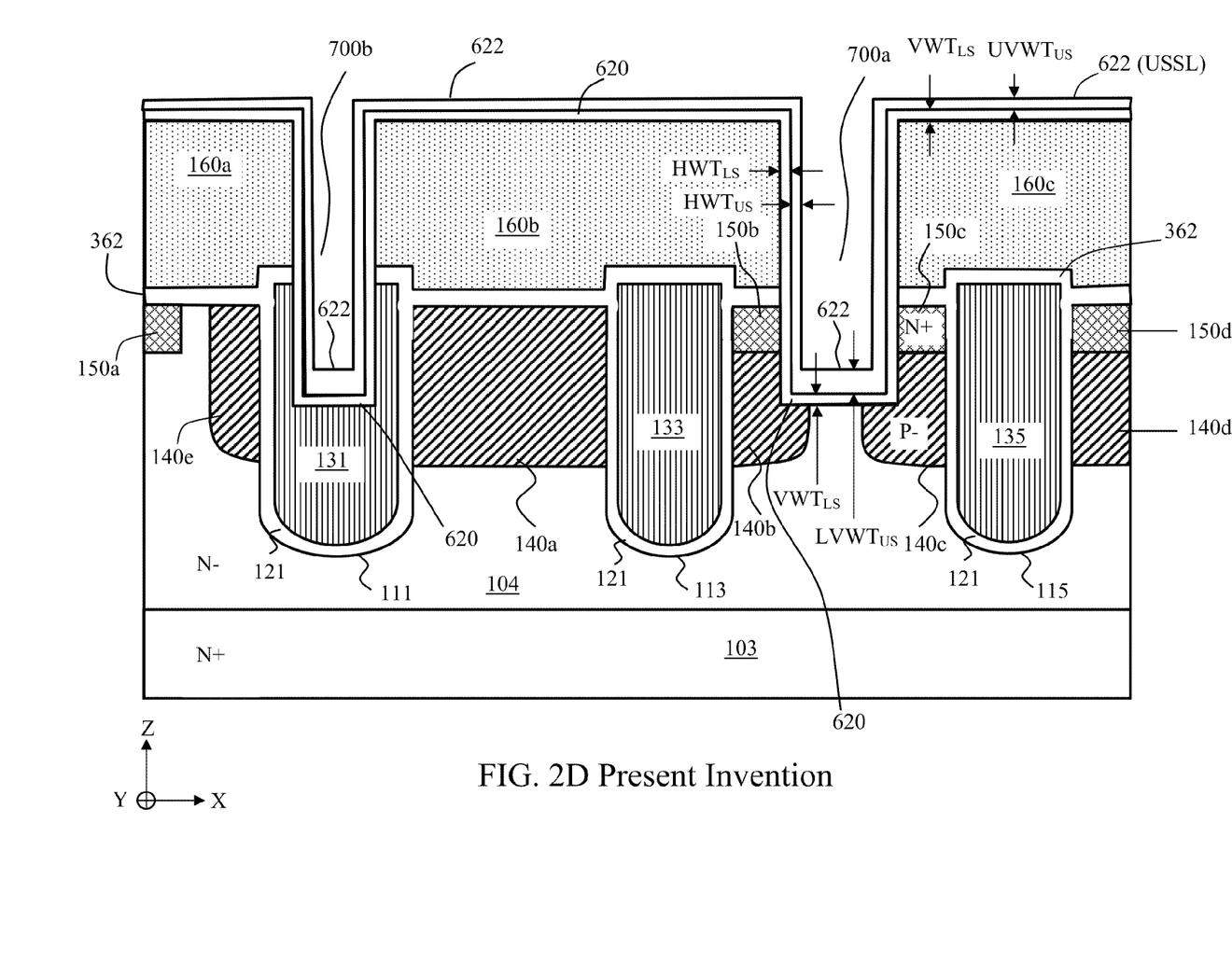

FIG. 2D illustrates the following steps:

d112) Formation of an upper spacer sub-layer (USSL) 622 atop the (LSSL) 620. The USSL 622 has a horizontal wall thickness ($HWT_{US}$) atop the side walls of the TCT (700a and 700b). The USSL 622 has a lower vertical wall thickness ($LVWT_{US}$) atop the bottom floor of the TCT and has an upper vertical wall thickness ($UVWT_{US}$) atop the dielectric material layer 160. It is important to point out that, while $UVWT_{US}$ is essentially equal to $HWT_{US}$, $LVWT_{US}$ is made much bigger than $HWT_{US}$.

d113) Furthermore, selecting the LSSL material and the USSL material such that:

the LSSL 620 would allow a through-transmission of a later body-implant beam while the USSL 622 would, with a sufficiently large layer thickness, block a through-transmission of the later body-implant beam; and the LSSL 620 acts as an etch-stop for a later USSL-etching step.

In one particular embodiment that satisfies the above steps, the LSSL material is silicon nitride and the USSL material is high density plasma deposited silicon oxide (HDPSO) that, owing to its deposition process, automatically satisfies the criterion $LVWT_{US} \gg HWT_{US}$. As a more specific example on device geometry, $VWT_{LS}$ can be from 100 to 500 Angstrom, $UVWT_{US}$ can be less than 0.1 micron while $LVWT_{US}$ can be from 0.3 to 0.4 micron.

Figure 2E:
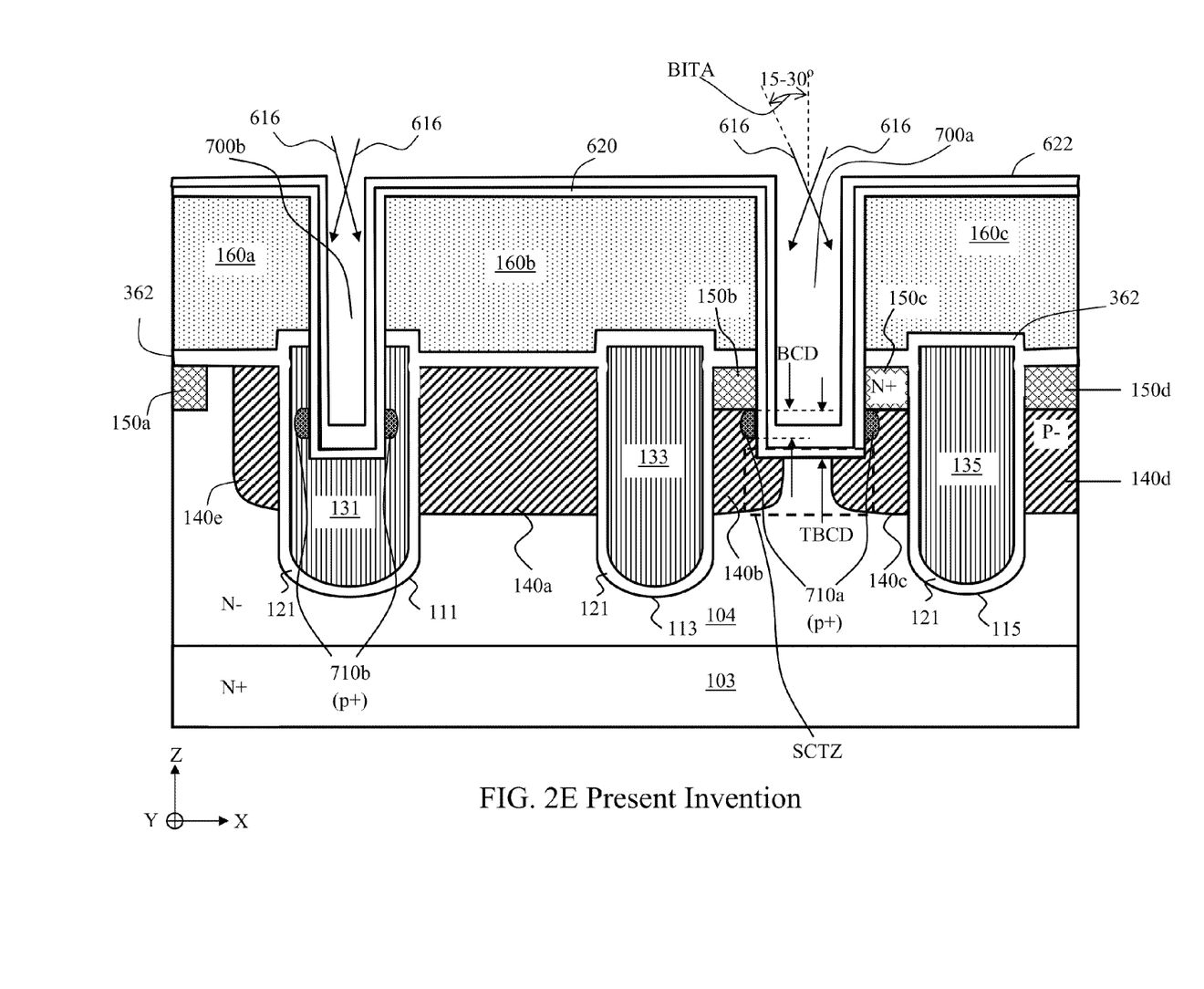

FIG. 2E illustrates the following step:

d114) Implanting, through a combined wall thickness of $HWT_{US}+HWT_{LS}$ near the bottom of the top contact trenches (TCT) 700a and 700b, a number of heavily-doped embedded body implant regions (EBIR) 710a and 710b. Meanwhile, owing to the relationship $LVWT_{US} \gg HWT_{US}$, the sub-contact trench zone (SCTZ) beneath the floor of TCT 700a is kept essentially free of any concomitant body-contact implantation.

The associated implantation beams are illustrated as body-implant beams 616 oriented, for aiming at the EBIR 710a and 710b, at a planetary body-implant tilt angle (BITA) with respect to the Z-axis. In one embodiment the planetary BITA is from 15 to 30 degrees and the EBIR 710a and 710b are in the form of P+ type pockets located on silicon sidewalls of the TCT 700a and 700b and are formed by implanting heavy boron beams. The P+ type pockets will then diffuse into the silicon with some thermal activation drive-in.

As an important remark, the P+ type EBIR 710a and 710b cannot be allowed to concomitantly reach thus bridging and electrically shorted to the SCTZ. Otherwise, an additional, thus undesirable, etching step of the TCT would be required to remove the bridging P+ type EBIR. In one practical example illustrating the significance of this remark, the implantation dosage of boron ions for the heavily-doped EBIR 710a is about $1 \times e15 \, cm^{-2}$ to form a resulting P+ type body contact. However, the implantation dosage of boron ions for the later ESIR 720a is, for controlling leakage current through its Schottky barrier, only about $1 \times e12 \, cm^{-2}$ that is three orders of magnitude lower than $1 \times e15 \, cm^{-2}$. Therefore, the SCTZ beneath the floor of TCT 700a should be kept essentially free of any significant concomitant body-contact implantation. Recall from the description of FIG. 2D that $LVWT_{US} \gg HWT_{US}$. While the combined thicknesses of the upper and lower extreme boundaries ($HWT_{US}$ and $HWT_{LS}$) is not enough to block the body-implant beams 616 from concomitantly implanting into the lower corner areas of the TCT 700a and the SCTZ, the thick $LVWT_{US}$ made of HDP is, as illustrated, sufficient to block the body-implant beams 616 from concomitantly implanting into the lower corner areas of the TCT 700a and the SCTZ. In a preferred embodiment, the ratio $LVWT_{US}/HWT_{US}$ should be higher than 3/1.

Figure 2F:
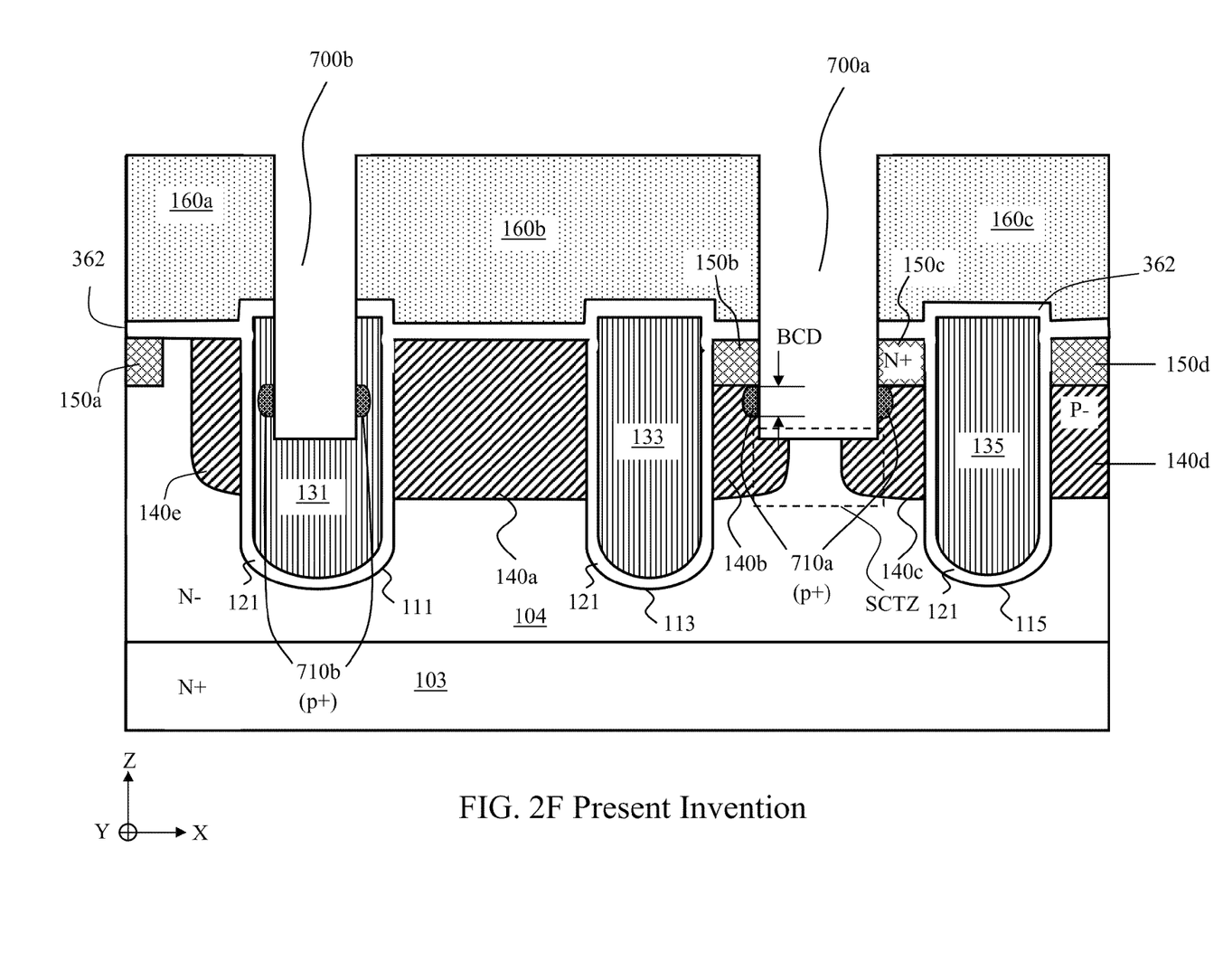

FIG. 2F illustrates the following step:

d115) Successively removing the USSL 622 with an USSL-etching step and removing the LSSL 620 with a LSSL-etching step.

While only the HDP is needed to block the body-implant beams 616 from reaching the SCTZ as just described above, the LSSL 620 is still needed as it functions as an etching stop for the USSL-etching. In a particular embodiment, LSSL 620 is made of silicon nitride.

Figure 2G:
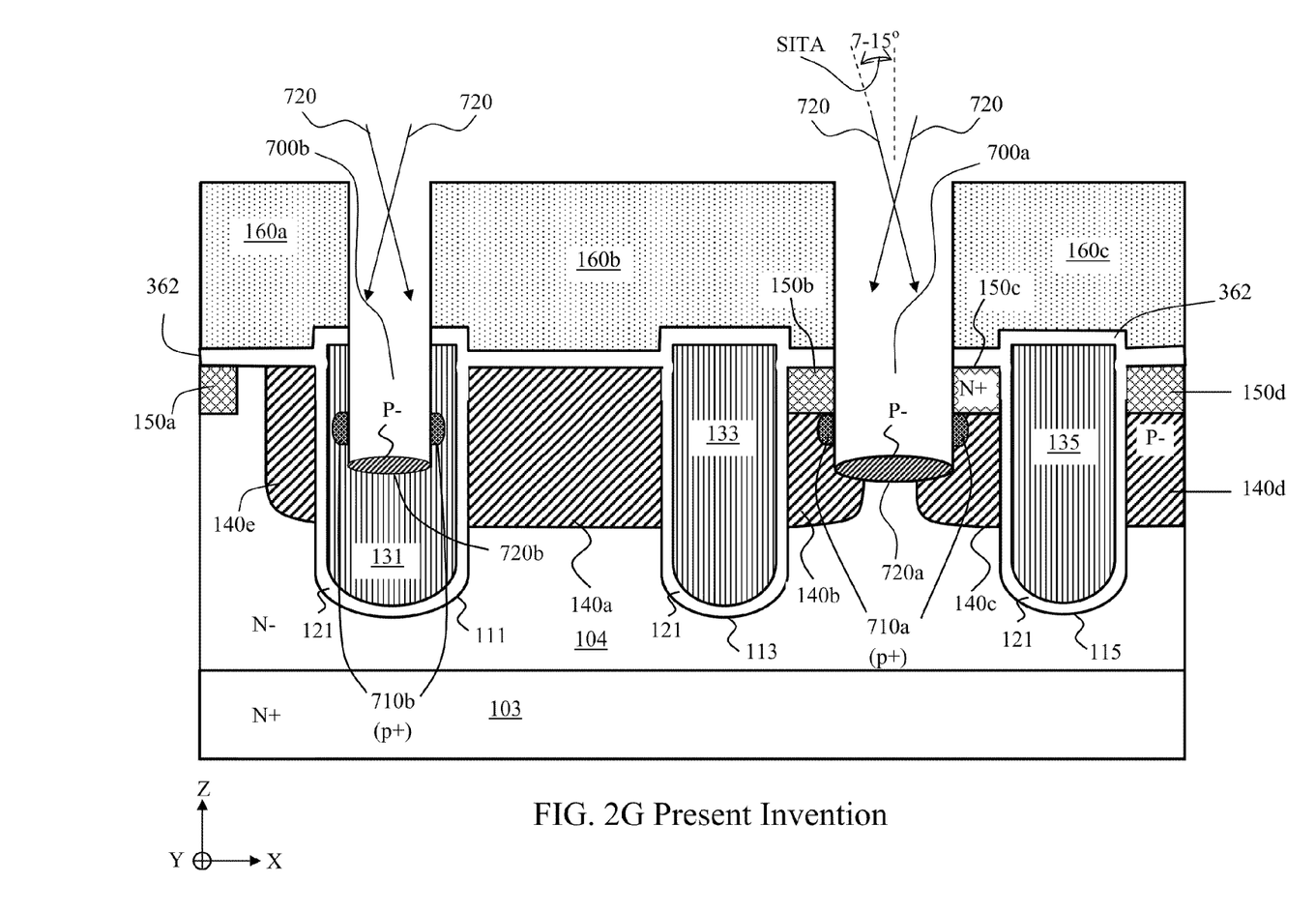

FIG. 2G illustrates the following step:

d21) Simultaneously implanting the P− type ESIR 720a into the SCTZ and the P− type ESIR 720b into the gate 131.

The associated implantation beams are illustrated as Shannon-implant beam 720 oriented, for aiming at the ESIR 720a and 720b, at a planetary Shannon-implant tilt angle (SITA) with respect to the Z-axis. In one embodiment the planetary SITA is from 7 to 15 degrees and the ESIR 720a and 720b are in the form of P− type pockets located beneath the bottom floors of the TCT 700a and 700b and the ESIR 720a is formed by lightly implanting boron beams into the N− type EPIL 104. The P− type pockets will then diffuse into the silicon with some thermal activation drive-in.

Figure 2H:
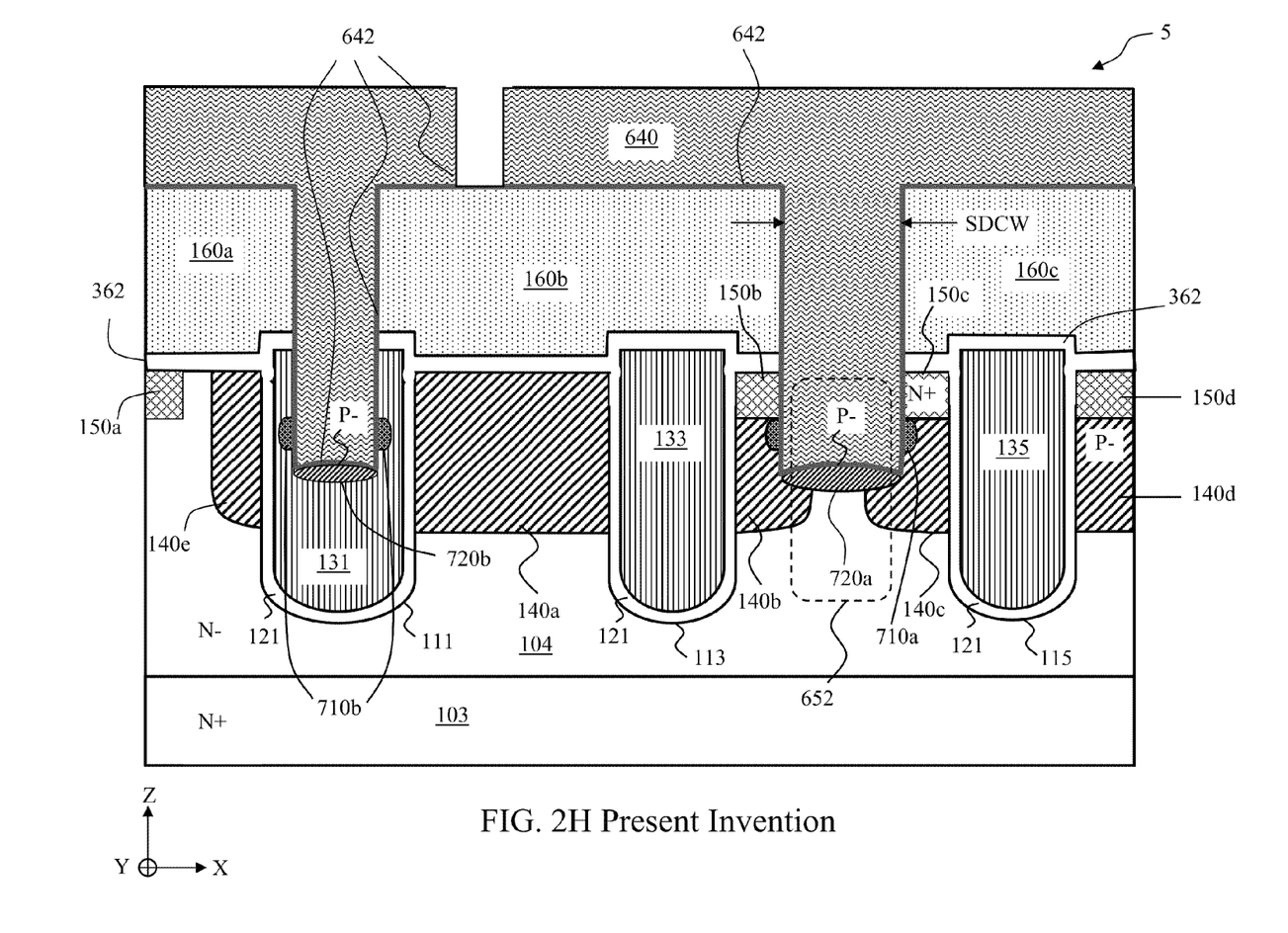

FIG. 2H illustrates the formation of a metal layer 640 in contact, via a contact barrier layer 642, with the ESIR (720a, 720b), the heavily-doped EBIR (710a, 710b), the body regions (140b, 140c) and the source regions (150b, 150c). Furthermore, the metal layer 640 fills the TCT (700a, 700b) and covers the insulating regions (160a, 160b, 160c). A desired MOSFET integrated with Schottky diode (MOSFET/SKY) 5 is thus formed, with only one-time etching of its TCT 700a, 700b, wherein an integrated Schottky diode 652, illustratively delineated with a dashed border, is structured as a serial connection of the metal layer 640, the ESIR 720a and the EPIL 104. Thus, the vertical side walls of the TCT 700a define a Schottky diode cross-sectional width (SDCW). Notice that the metal layer 640 is patterned into segments separately contacting the active MOSFET and the gate 131. Additionally, the P+ type EBIR 710b in the gate 131 now turns into a gate contact electrode.

The steps for forming the metal layer 640 itself are known to those skilled in the art and comprise depositing titanium/titanium nitride (Ti/TiN), forming a titanium silicide and filling the metal layer. An upward, vertical cross sectioning of the Schottky diode 652 would successively go through the following material layers:

1. N+ type silicon SCST 103.
2. N− type silicon EPIL 104.
3. P− type silicon ESIR 720a.
4. Silicide.
5. Titanium nitride TiN.
6. Metal (aluminum, copper, etc.).

In the above, a Schottky barrier (of the Schottky diode 652) is formed between layers 4 and 3.

While the description above contains many specificities, these specificities should not be construed as accordingly limiting the scope of the present invention but as merely providing illustrations of numerous presently preferred embodiments of this invention. Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

We claim:

1. A method for fabricating a MOSFET integrated with Schottky diode (MOSFET/SKY), expressed in an X-Y-Z Cartesian coordinate system with the X-Y plane parallel to its major semiconductor chip plane, comprising:
   a) forming, in an epitaxial layer overlaying a semiconductor substrate, a gate trench and depositing gate material therein;
   b) forming a body region in the epitaxial layer, a source region atop the body region and a dielectric region atop the gate trench and the source region;
   c) etching a top contact trench (TCT) with vertical side walls defining a X-Y cross sectional boundary for containing a Schottky diode there within, said X-Y cross sectional boundary
      c1) going through the dielectric region and the source region thus defining a source-contact depth (SCD); and
      c2) going partially into the body region by a predetermined total body-contact depth (TBCD);
   d) creating:
      d1) into the side walls of the TCT and beneath the SCD, a heavily-doped embedded body implant region (EBIR) of body-contact depth (BCD)<TBCD; and
      d2) into a sub-contact trench zone (SCTZ) beneath the floor of the TCT, an embedded Shannon implant region (ESIR); and
   e) forming a metal layer:
      e1) in contact with the ESIR, the body region and the source region; and
      e2) filling the TCT and covering the dielectric region whereby completing the MOSFET/SKY with only one-time etching of its TCT.

2. The method of claim 1 wherein creating the heavily-doped EBIR and the ESIR comprising:
   d11) implanting the heavily-doped EBIR while keeping the SCTZ essentially free of any concomitant body-contact implantation; and
   d21) implanting the ESIR into the SCTZ.

3. The method of claim 2 wherein implanting the heavily-doped EBIR while keeping the SCTZ essentially free of any concomitant body-contact implantation comprising:

d111) forming a lower spacer sub-layer (LSSL) of horizontal wall thickness ($HWT_{LS}$) atop the side walls of the TCT and of vertical wall thickness ($VWT_{LS}$) atop the bottom floor of the TCT and atop the dielectric region with $VWT_{LS}$ essentially equal to $HWT_{LS}$;
   d112) atop the LSSL, forming an upper spacer sub-layer (USSL) of horizontal wall thickness ($HWT_{US}$) atop the side walls of the TCT, of lower vertical wall thickness ($LVWT_{US}$) atop the bottom floor of the TCT and of upper vertical wall thickness ($UVWT_{US}$) atop the dielectric region with $UVWT_{US}$ essentially equal to $HWT_{US}$ but $LVWT_{US} \gg HWT_{US}$;
   d113) selecting the LSSL material and the USSL material such that:
      the LSSL would allow a through-transmission of a later body-implant beam while the USSL would, with a sufficiently large layer thickness, block a through-transmission of the later body-implant beam; and
      the LSSL acts as an etch-stop for a later USSL-etching step;
   d114) implanting, with the body-implant beam at a planetary body-implant tilt angle (BITA) with respect to the Z-axis and through a combined wall thickness of $HWT_{US}+HWT_{LS}$, the heavily-doped EBIR while, owing to the relationship $LVWT_{US} \gg HWT_{US}$, keeping the SCTZ essentially free of any concomitant body-contact implantation whereby avoiding the otherwise concomitant body-contact implantation, into the SCTZ and bridging the EBIR, that would require an undesirable additional etching of the TCT to remove; and
   d115) successively removing the USSL and the LSSL with an USSL-etching step and a LSSL-etching step.

4. The method of claim 3 wherein $LVWT_{US} > 3*HWT_{US}$.

5. The method of claim 3 wherein:
the LSSL material is silicon nitride and the USSL material is high density plasma deposited silicon oxide (HDPSO);
$VWT_{LS}$ is from 100 to 500 Angstrom;
$UVWT_{US}$ is less than 0.1 micron while $LVWT_{US}$ is from 0.3 to 0.4 micron; and
The planetary BITA is from 15 to 30 degrees.

6. The method of claim 2 wherein implanting the ESIR into the SCTZ comprises implanting, with a Shannon-implant beam at a planetary Shannon-implant tilt angle (SITA) with respect to the Z-axis, the ESIR into the SCTZ.

7. The method of claim 6 wherein the planetary SITA is from about 7 degrees to about 15 degrees.

8. The method of claim 1 wherein forming the metal layer comprises depositing titanium/titanium nitride (Ti/TiN), forming a titanium silicide and filling the metal layer.

* * * * *